(12) United States Patent
Nisbet et al.

(10) Patent No.: US 12,348,252 B2
(45) Date of Patent: *Jul. 1, 2025

(54) RADIO FREQUENCY TRIMMER CIRCUIT

(71) Applicant: Skyworks Solutions, Inc., Irvine, CA (US)

(72) Inventors: John Jackson Nisbet, Ottawa (CA); Hassan Sarbishaei, Ottawa (CA); Guillaume Alexandre Blin, Carlisle, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/471,113

(22) Filed: Sep. 20, 2023

(65) Prior Publication Data

US 2024/0113735 A1   Apr. 4, 2024

Related U.S. Application Data

(63) Continuation of application No. 17/445,444, filed on Aug. 19, 2021, now Pat. No. 11,811,438.

(60) Provisional application No. 63/068,815, filed on Aug. 21, 2020.

(51) Int. Cl.
*H04B 1/04* (2006.01)
*H03F 3/193* (2006.01)

(52) U.S. Cl.
CPC ........... *H04B 1/0483* (2013.01); *H03F 3/193* (2013.01); *H04B 1/0458* (2013.01); *H04B 1/0475* (2013.01)

(58) Field of Classification Search
CPC ...... H04B 1/005; H04B 1/006; H04B 1/0064; H04B 1/0067; H04B 1/0458; H04B 1/0475; H04B 1/0483; H04B 1/38; H04B 1/40; H04B 1/44; H04B 1/48; H04B 7/02; H04B 7/022; H04B 7/04; H04B 7/0404; H04B 7/0408; H03F 3/193
USPC .... 375/219, 259–262, 265, 267; 455/73, 78, 455/553.1
See application file for complete search history.

(56) References Cited

U.S. PATENT DOCUMENTS

| | | | |
|---|---|---|---|
| 4,342,003 A | 7/1982 | Saari | |
| 6,333,677 B1 * | 12/2001 | Dening | H03F 1/302 330/296 |
| 9,160,328 B2 | 10/2015 | Altunkilic et al. | |

(Continued)

FOREIGN PATENT DOCUMENTS

| | | |
|---|---|---|
| CN | 1801487 | 7/2006 |
| DE | 10 2021 212 644 A1 | 5/2022 |

(Continued)

*Primary Examiner* — Young T. Tse
(74) *Attorney, Agent, or Firm* — Knobbe, Martens, Olson & Bear, LLP

(57) ABSTRACT

Systems and methods for magnitude and phase trimming are provided. In one aspect, a radio frequency (RF) trimmer circuit includes an input terminal configured to receive an RF signal, an output terminal configured to output the RF signal, a control input configured to receive a control signal, at least one impedance element, and at least one transistor configured to selectively connect the impedance element onto a path between the input and output terminals. The selectively connecting the impedance element controls at least one of a magnitude trim and a phase trim of the RF signal.

17 Claims, 13 Drawing Sheets

(56) References Cited

U.S. PATENT DOCUMENTS

| | | |
|---|---|---|
| 10,255,982 B2 | 4/2019 | Zhou et al. |
| 10,643,727 B2 | 5/2020 | Zhou et al. |
| 11,289,432 B2 | 3/2022 | Fuh et al. |
| 11,451,248 B2 | 9/2022 | Cook et al. |
| 11,496,167 B2 | 11/2022 | Nisbet |
| 11,539,288 B2 | 12/2022 | Zhou et al. |
| 11,614,760 B2 | 3/2023 | Liang et al. |
| 2004/0185916 A1 | 9/2004 | Chang et al. |
| 2004/0251987 A1 | 12/2004 | Nakamura et al. |
| 2005/0206478 A1 | 9/2005 | Satoh et al. |
| 2007/0290704 A1 | 12/2007 | Shyh et al. |
| 2008/0278203 A1 | 11/2008 | Obkircher |
| 2009/0195317 A1 | 8/2009 | Zhang et al. |
| 2010/0156476 A1 | 6/2010 | Obkircher |
| 2011/0176591 A1 | 7/2011 | Sawatzky |
| 2011/0235772 A1 | 9/2011 | Obkircher |
| 2012/0044980 A1 | 2/2012 | Zhang et al. |
| 2015/0171860 A1 | 6/2015 | Blin |
| 2015/0326205 A1 | 11/2015 | Cho et al. |
| 2016/0028147 A1 | 1/2016 | Srirattana et al. |
| 2016/0028420 A1 | 1/2016 | Srirattana et al. |
| 2016/0127014 A1 | 5/2016 | Wloczysiak |
| 2016/0344430 A1 | 11/2016 | Srirattana et al. |
| 2016/0344431 A1 | 11/2016 | Srirattana et al. |
| 2017/0026090 A1 | 1/2017 | Wloczysiak |
| 2017/0063324 A1 | 3/2017 | Cook et al. |
| 2017/0085245 A1 | 3/2017 | Srirattana et al. |
| 2017/0126208 A1 | 5/2017 | Cho et al. |
| 2017/0264250 A1 | 9/2017 | Park et al. |
| 2017/0264251 A1 | 9/2017 | Cook et al. |
| 2017/0324451 A1 | 11/2017 | Wloczysiak |
| 2018/0034661 A1 | 2/2018 | Zhou et al. |
| 2018/0062621 A1 | 3/2018 | Yan et al. |
| 2018/0069529 A1 | 3/2018 | Bi et al. |
| 2018/0262162 A1 | 9/2018 | Lyalin et al. |
| 2019/0235050 A1* | 8/2019 | Maligeorgos ............ G01S 7/032 |
| 2019/0334481 A1 | 10/2019 | Lyalin et al. |
| 2019/0386617 A1 | 12/2019 | Naraine |
| 2020/0153403 A1 | 5/2020 | Lee et al. |
| 2020/0153428 A1 | 5/2020 | Popplewell et al. |
| 2020/0161760 A1 | 5/2020 | Domino |
| 2020/0161761 A1 | 5/2020 | Domino |
| 2020/0228064 A1* | 7/2020 | Datta ...................... H04B 1/40 |
| 2020/0389128 A1* | 12/2020 | Samata .................. H03F 3/245 |
| 2021/0173807 A1 | 6/2021 | Obkircher |
| 2021/0203280 A1 | 7/2021 | Naraine et al. |
| 2021/0218373 A1 | 7/2021 | Jain et al. |
| 2021/0257458 A1 | 8/2021 | Roy et al. |
| 2021/0273612 A1 | 9/2021 | Korba et al. |
| 2022/0060202 A1 | 2/2022 | Nisbet et al. |
| 2022/0190790 A1 | 6/2022 | Caron et al. |
| 2022/0190803 A1 | 6/2022 | Azizi et al. |
| 2022/0200560 A1 | 6/2022 | Azizi et al. |
| 2022/0200577 A1 | 6/2022 | Azizi et al. |
| 2022/0247359 A1 | 8/2022 | Johnson et al. |
| 2022/0254812 A1 | 8/2022 | Wang et al. |
| 2022/0278707 A1 | 9/2022 | Liang et al. |
| 2022/0294404 A1 | 9/2022 | Nisbet et al. |
| 2022/0302586 A1 | 9/2022 | Domino |
| 2022/0321151 A1 | 10/2022 | Zhu et al. |
| 2022/0329268 A1 | 10/2022 | Pehlke |
| 2022/0329273 A1 | 10/2022 | Pehlke |
| 2022/0344801 A1 | 10/2022 | Kovacic et al. |
| 2022/0344810 A1 | 10/2022 | Kovacic et al. |
| 2022/0344833 A1 | 10/2022 | Blin |
| 2022/0345172 A1 | 10/2022 | Blin et al. |
| 2022/0385249 A1 | 12/2022 | Brunel et al. |
| 2022/0413533 A1 | 12/2022 | Liang et al. |
| 2023/0012894 A1 | 1/2023 | Liang et al. |
| 2023/0038733 A1 | 2/2023 | Blin et al. |
| 2023/0085532 A1 | 3/2023 | Zhou et al. |
| 2023/0095653 A1 | 3/2023 | Jain et al. |
| 2023/0100609 A1 | 3/2023 | Liang et al. |
| 2023/0107607 A1 | 4/2023 | Nisbet et al. |
| 2023/0112435 A1 | 4/2023 | Naseri Ali Abadi et al. |
| 2023/0114964 A1 | 4/2023 | Blin et al. |

FOREIGN PATENT DOCUMENTS

| | | |
|---|---|---|
| EP | 2 870 694 B1 | 9/2020 |
| GB | 2604220 A | 8/2022 |

* cited by examiner

RADIO FREQUENCY TRIMMER CIRCUIT

CROSS-REFERENCE TO RELATED APPLICATION(S)

This application is a continuation of U.S. Non-Provisional application Ser. No. 17/445,444, filed Aug. 19, 2021, now U.S. Pat. No. 11,811,438, which claims the benefit of U.S. Provisional Application No. 63/068,815, filed Aug. 21, 2020. Each of the foregoing applications are hereby incorporated by reference in their entirety. Any and all applications for which a foreign or domestic priority claim is identified in the Application Data Sheet as filed with the present application are hereby incorporated by reference under 37 CFR 1.57.

BACKGROUND

Technological Field

Aspects of this disclosure relate to beamforming communication systems, and in particular, systems and methods for magnitude and phase trimming.

Description of the Related Technology

Communications systems can employ an antenna array to provide beam formation and directivity for transmission and/or reception of signals. Such systems may communicate using various frequency carriers including, for example, millimeter wave carriers (for instance, 30 GHz to 300 GHz), centimeter wave carriers (for instance, 3 GHz to 30 GHz), and/or other frequency carriers. It can be important to provide precise control of magnitude and phase in beam forming systems, particularly for higher frequency systems.

SUMMARY OF CERTAIN INVENTIVE ASPECTS

The systems, methods and devices of this disclosure each have several innovative aspects, no single one of which is solely responsible for the desirable attributes disclosed herein.

In one aspect, there is provided a radio frequency trimmer circuit comprising: an input terminal configured to receive an radio frequency signal; an output terminal configured to output the radio frequency signal; a control input configured to receive a control signal; at least one impedance element; and at least one transistor configured to control at least one of a magnitude trim and a phase trim of the radio frequency signal to selectively connect the impedance element onto a path between the input and output terminals.

In some embodiments, the at least one impedance element includes a first series resistor, the path includes a second series resistor, the at least one transistor is configured to selectively connect the first series resistor is parallel to the second series resistor.

In some embodiments, the at least one transistor is configured to provide a first amount of magnitude trim by connecting the first series resistor in parallel to the second series resistor in response to the control signal having a positive value and a second amount of magnitude trim by disconnecting the first series resistor from the second series resistor in response to the control signal having a negative value, the first amount of magnitude trim being less than the second amount of magnitude trim.

In some embodiments, the at least one impedance element includes a shunt resistor, the path includes a series resistor, the at least one transistor is configured to selectively connect the shunt resistor to the series resistor.

In some embodiments, the at least one transistor is configured to provide a first amount of magnitude trim by connecting the shunt resistor to the series resistor in response to the control signal having a positive value and a second amount of magnitude trim by disconnecting the shunt resistor from the series resistor in response to the control signal having a negative value, the first amount of magnitude trim being greater than the second amount of magnitude trim.

In some embodiments, the at least one impedance element includes a series capacitor, the path includes a series resistor, the at least one transistor is configured to selectively connect the series capacitor is parallel to the series resistor.

In some embodiments, the at least one transistor is configured to provide a first amount of phase trim by connecting the series capacitor in parallel to the series resistor in response to the control signal having a positive value and a second amount of phase trim by disconnecting the series capacitor from the series resistor in response to the control signal having a negative value, the first amount of phase trim having a greater phase advance than the second amount of phase trim.

In some embodiments, the at least one impedance element includes a shunt capacitor, the path includes a series resistor, the at least one transistor is configured to selectively connect the shunt capacitor to the series resistor.

In some embodiments, the at least one transistor is configured to provide a first amount of phase trim by connecting the shunt capacitor to the series resistor in response to the control signal having a positive value and a second amount of phase trim by disconnecting the shunt capacitor from the series resistor in response to the control signal having a negative value, the first amount of phase trim having a greater phase delay than the second amount of phase trim.

In another aspect, there is provided a front end system comprising: a plurality of transmitters configured to provide a radio frequency signal to a plurality of antennae; a plurality of receivers configured to receive the radio frequency signal from the antennae; and at least one trimmer connected to at least one of the transmitters or at least one of the receivers and configured to trim the radio frequency signal for beam forming, the at least one trimmer including an input terminal configured to receive the radio frequency signal, an output terminal configured to output the radio frequency signal, a control input configured to receive a control signal, at least one impedance element, and at least one transistor configured to control at least one of a magnitude trim and a phase trim of the radio frequency signal to selectively connect the impedance element onto a path between the input and output terminals.

In some embodiments, the at least one impedance element includes a first series resistor, the path includes a second series resistor, the at least one transistor is configured to selectively connect the first series resistor is parallel to the second series resistor.

In some embodiments, the at least one transistor is configured to provide a first amount of magnitude trim by connecting the first series resistor in parallel to the second series resistor in response to the control signal having a positive value and a second amount of magnitude trim by disconnecting the first series resistor from the second series resistor in response to the control signal having a negative value, the first amount of magnitude trim being less than the second amount of magnitude trim.

In some embodiments, the at least one impedance element includes a shunt resistor, the path includes a series resistor, the at least one transistor is configured to selectively connect the shunt resistor to the series resistor.

In some embodiments, the at least one transistor is configured to provide a first amount of magnitude trim by connecting the shunt resistor to the series resistor in response to the control signal having a positive value and a second amount of magnitude trim by disconnecting the shunt resistor from the series resistor in response to the control signal having a negative value, the first amount of magnitude trim being greater than the second amount of magnitude trim.

In some embodiments, the at least one impedance element includes a series capacitor, the path includes a series resistor, the at least one transistor is configured to selectively connect the series capacitor is parallel to the series resistor.

In some embodiments, the at least one transistor is configured to provide a first amount of phase trim by connecting the series capacitor in parallel to the series resistor in response to the control signal having a positive value and a second amount of phase trim by disconnecting the series capacitor from the series resistor in response to the control signal having a negative value, the first amount of phase trim having a greater phase advance than the second amount of phase trim.

In yet another aspects, there is provided a mobile device comprising: a plurality of antennae; and a front end system including a plurality of transmitters configured to provide a radio frequency signal to the antennae, a plurality of receivers configured to receive the radio frequency signal from the antenna, and at least one trimmer connected to at least one of the transmitters or at least one of the receivers and configured to trim the radio frequency signal for beam forming, the at least one trimmer including an input terminal configured to receive the radio frequency signal, an output terminal configured to output the radio frequency signal, a control input configured to receive a control signal, at least one impedance element, and at least one transistor configured to control at least one of a magnitude trim and a phase trim of the radio frequency signal to selectively connect the impedance element onto a path between the input and output terminals.

In some embodiments, the at least one impedance element includes a first series resistor, the path includes a second series resistor, the at least one transistor is configured to selectively connect the first series resistor is parallel to the second series resistor.

In some embodiments, the at least one transistor is configured to provide a first amount of magnitude trim by connecting the first series resistor in parallel to the second series resistor in response to the control signal having a positive value and a second amount of magnitude trim by disconnecting the first series resistor from the second series resistor in response to the control signal having a negative value, the first amount of magnitude trim being less than the second amount of magnitude trim.

In some embodiments, the at least one impedance element includes a shunt resistor, the path includes a series resistor, the at least one transistor is configured to selectively connect the shunt resistor to the series resistor.

DETAILED DESCRIPTION OF CERTAIN INVENTIVE EMBODIMENTS

Figure 1:
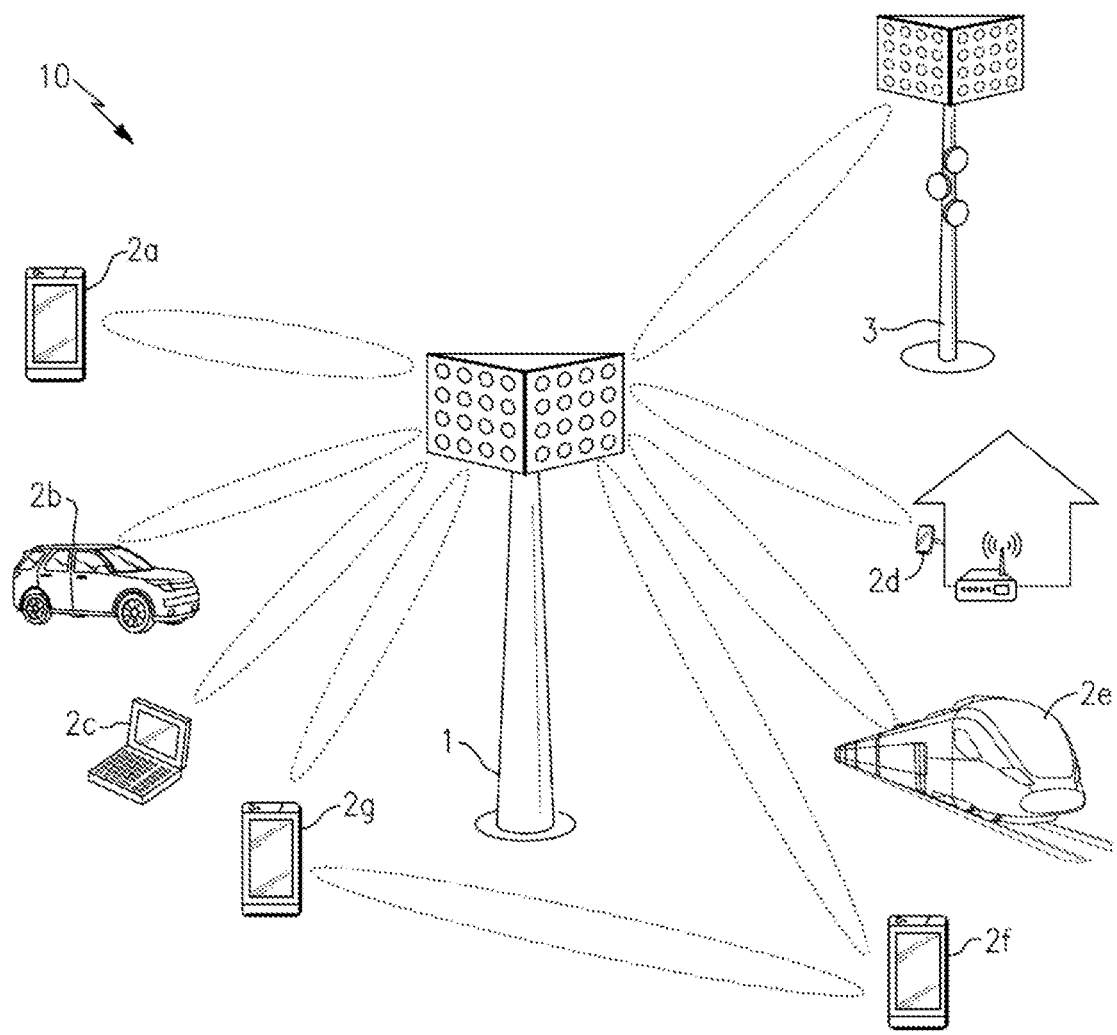
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
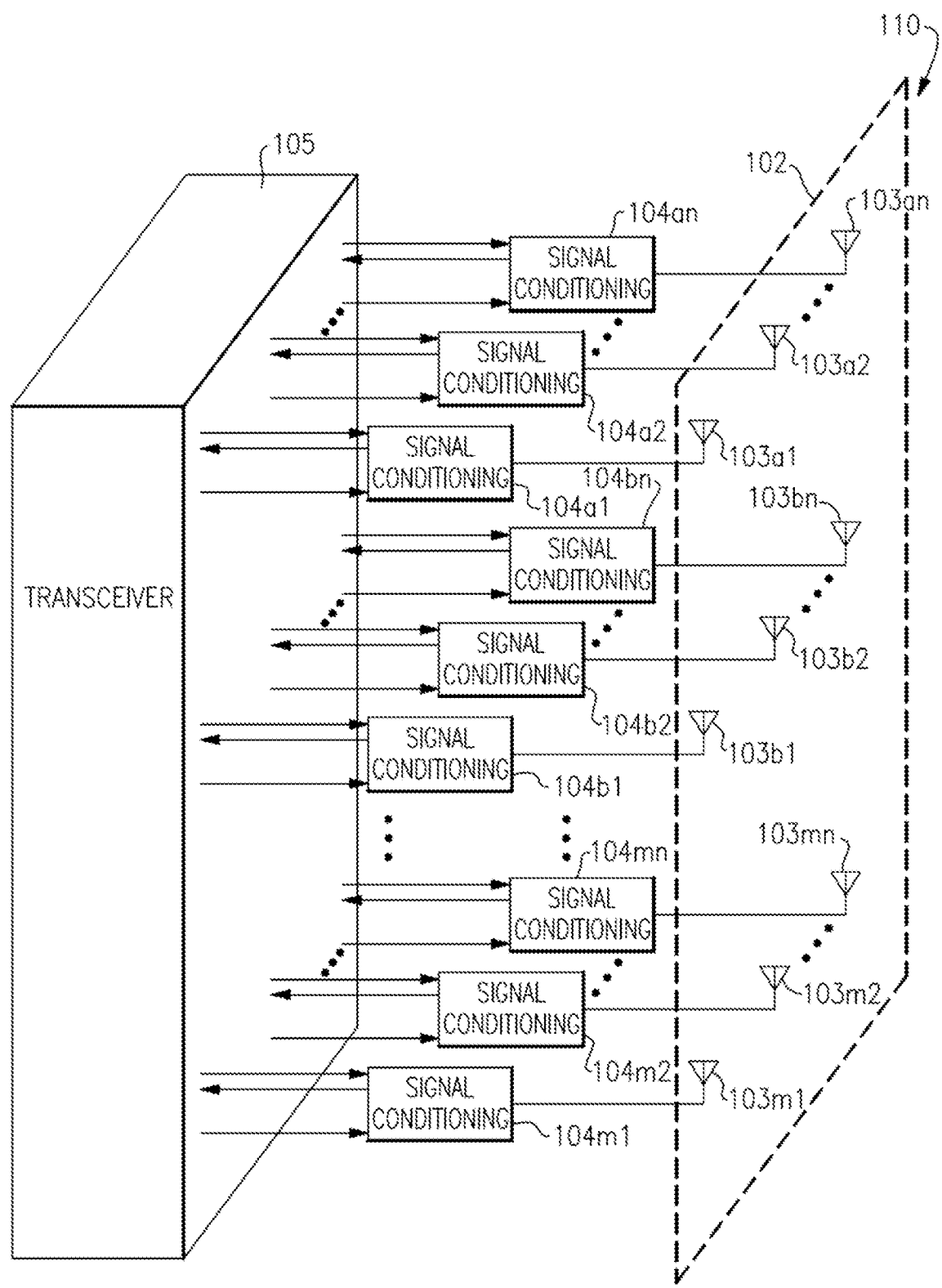
FIG. 2A is a schematic diagram of one example of a communication system that operates with beamforming.

FIG. 2A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 2A, the transceiver 105 generates control signals for the signal conditioning circuits. The control signals can be used for a variety of functions, such as controlling the gain and phase of transmitted and/or received signals to control beamforming.

Figure 2B:
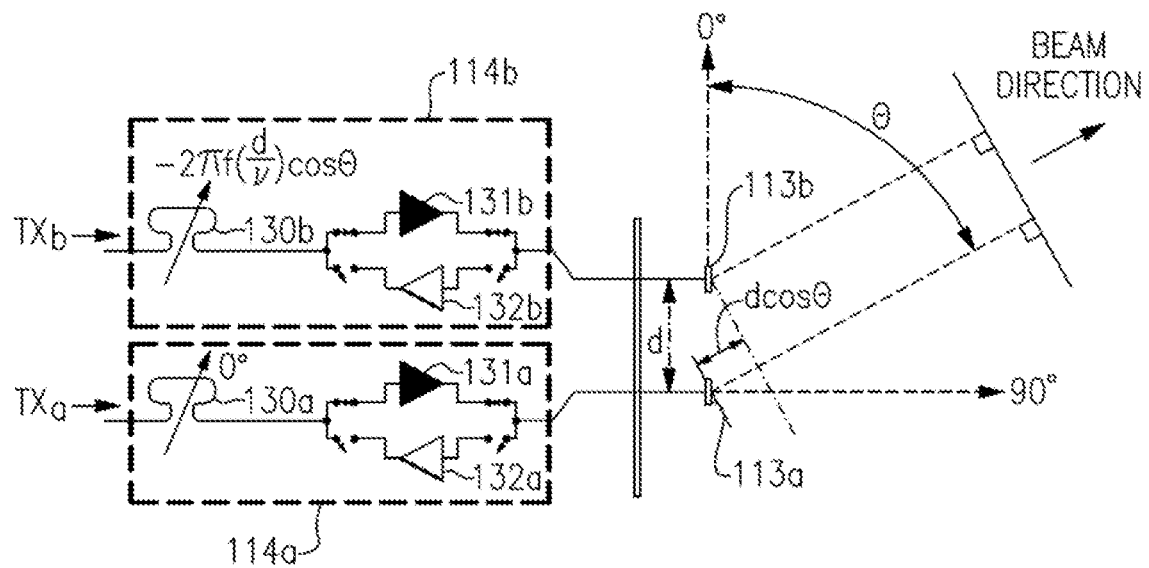
FIG. 2B is a schematic diagram of one example of beamforming to provide a transmit beam.

FIG. 2B is a schematic diagram of one example of beamforming to provide a transmit beam. FIG. 2B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 2B illustrates one embodiment of a portion of the communication system 110 of FIG. 2A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 2B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and $\pi$ is the mathematic constant pi.

In certain implementations, the distance d is implemented to be about ½ $\lambda$, where $\lambda$, is the wavelength of the fundamental component of the transmit signal. In such implementations, the second phase shifter 130b can be controlled to provide a phase shift of about $-\pi\cos\theta$ radians to achieve a transmit beam angle $\theta$.

Accordingly, the relative phase of the phase shifters 130a, 130b can be controlled to provide transmit beamforming. In certain implementations, a baseband processor and/or a transceiver (for example, the transceiver 105 of FIG. 2A) controls phase values of one or more phase shifters and gain values of one or more controllable amplifiers to control beamforming.

Figure 2C:
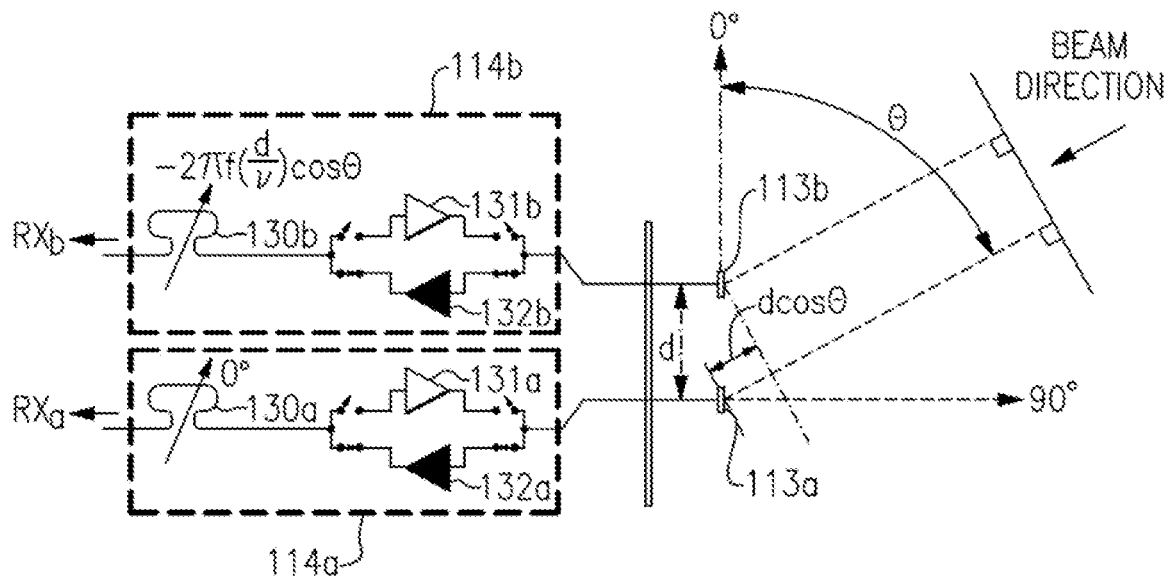
FIG. 2C is a schematic diagram of one example of beamforming to provide a receive beam.

FIG. 2C is a schematic diagram of one example of beamforming to provide a receive beam. FIG. 2C is similar to FIG. 2B, except that FIG. 2C illustrates beamforming in the context of a receive beam rather than a transmit beam.

As shown in FIG. 2C, a relative phase difference between the first phase shifter 130a and the second phase shifter 130b can be selected to about equal to $-2\pi f(d/v)\cos\theta$ radians to achieve a desired receive beam angle $\theta$. In implementations in which the distance d corresponds to about ½ $\lambda$, the phase difference can be selected to about equal to $-\pi\cos\theta$ radians to achieve a receive beam angle $\theta$.

Although various equations for phase values to provide beamforming have been provided, other phase selection values are possible, such as phase values selected based on implementation of an antenna array, implementation of signal conditioning circuits, and/or a radio environment.

Figure 3A:
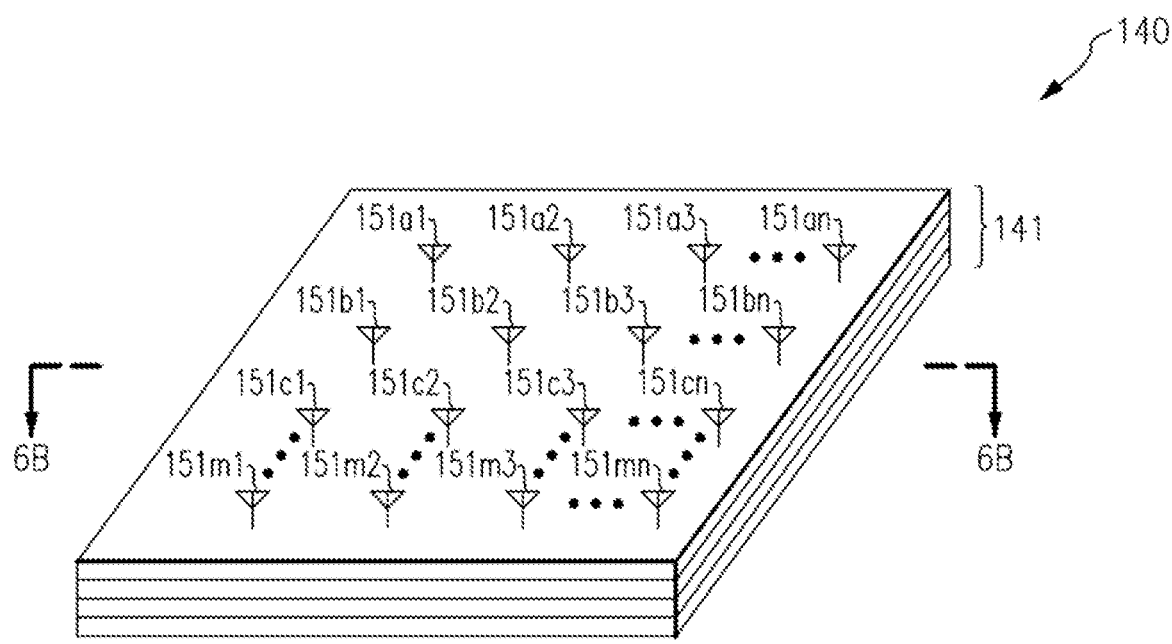
FIG. 3A is a perspective view of one embodiment of a module that operates with beamforming.
Figure 3B:
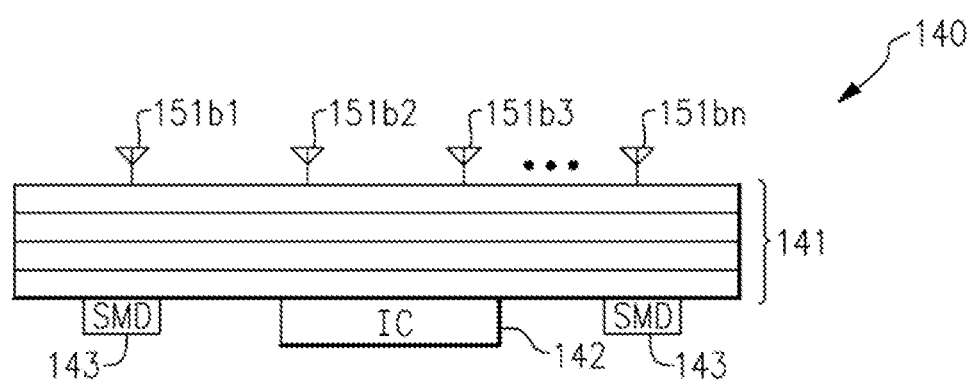
FIG. 3B is a cross-section of the module of FIG. 3A taken along the lines 6B-6B.

FIG. 3A is a perspective view of one embodiment of a module 140 that operates with beamforming. FIG. 3B is a cross-section of the module 140 of FIG. 3A taken along the lines 6B-6B.

The module 140 includes a laminated substrate or laminate 141, a semiconductor die or IC 142 (not visible in FIG. 3A), surface mount devices (SMDs) 143 (not visible in FIG. 3A), and an antenna array including antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn.

Although one embodiment of a module is shown in FIGS. 3A and 3B, the teachings herein are applicable to modules implemented in a wide variety of ways. For example, a module can include a different arrangement of and/or number of antenna elements, dies, and/or surface mount devices. Additionally, the module 140 can include additional structures and components including, but not limited to, encapsulation structures, shielding structures, and/or wirebonds.

The antenna elements antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn are formed on a first surface of the laminate 141, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive and/or for different communication bands.

In the illustrated embodiment, the IC 142 is on a second surface of the laminate 141 opposite the first surface. However, other implementations are possible. In one example, the IC 142 is integrated internally to the laminate 141.

In certain implementations, the IC 142 includes signal conditioning circuits associated with the antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn. In one embodiment, the IC 142 includes a serial interface, such as a mobile industry processor interface radio frequency front-end (MIPI RFFE) bus and/or inter-integrated circuit (I2C) bus that receives data for controlling the signal conditioning circuits, such as the amount of phase shifting provided by phase shifters. In another embodiment, the IC 142 includes signal conditioning circuits associated with the antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn and an integrated transceiver.

The laminate 141 can include various structures including, for example, conductive layers, dielectric layers, and/or solder masks. The number of layers, layer thicknesses, and materials used to form the layers can be selected based on a wide variety of factors, and can vary with application and/or implementation. The laminate 141 can include vias for providing electrical connections to signal feeds and/or ground feeds of the antenna elements. For example, in certain implementations, vias can aid in providing electrical connections between signal conditioning circuits of the IC 142 and corresponding antenna elements.

The antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn can correspond to antenna elements implemented in a wide variety of ways. In one example, the array of antenna elements includes patch antenna element formed from a patterned conductive layer on the first side of the laminate 141, with a ground plane formed using a conductive layer on opposing side of the laminate 141 or internal to the laminate 141. Other examples of antenna elements include, but are not limited to, dipole antenna elements, ceramic resonators, stamped metal antennas, and/or laser direct structuring antennas.

The module 140 can be included in a communication system, such as a mobile phone or base station. In one example, the module 140 is attached to a phone board of a mobile phone.

Figure 4:
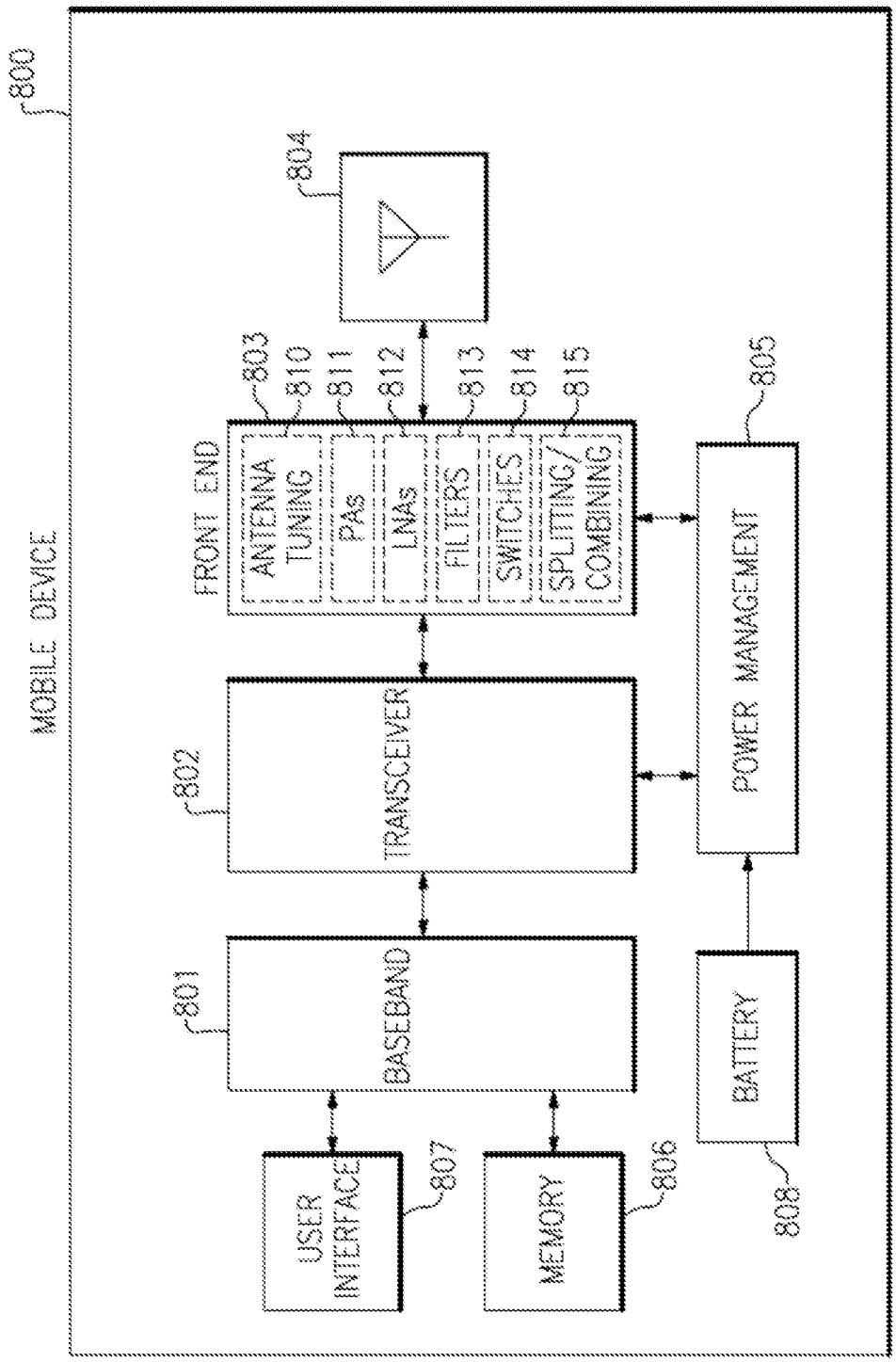
FIG. 4 is a schematic diagram of one embodiment of a mobile device.

FIG. 4 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 4 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 4, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 4, the power management system 805 receives a battery voltage from the battery 808. The battery 808 can be any suitable battery for use in the mobile device 800, including, for example, a lithium-ion battery.

Examples of Circuits for Magnitude and Phase Trimming

As described above, communications systems can employ an antenna array to provide beam formation and directivity for transmission and/or reception of signals. Such systems may communicate using various frequency carriers including, for example, millimeter wave carriers (for instance, 30 GHz to 300 GHz), centimeter wave carriers (for instance, 3 GHz to 30 GHz), and/or other frequency carriers. It can be important to provide precise control of magnitude and phase in beam forming systems, particularly for higher frequency systems including millimeter wave carriers.

In some RF applications, for example millimeter-wave antenna beam steering, the magnitude and phase of the transfer functions of multiple transmit or receive chains must be matched to a high degree of precision. This precision ultimately determines the accuracy of the beam direction, and therefore the coverage and capacity of the overall system. Whether or not these transmit and receive chains are on the same chip, phase and magnitude offsets will be observed between them caused by systematic factors (differences in layout or adjacent devices) and random factors (normal statistical variation of resistors, capacitors or transistors).

In order to perform accurate antenna beam steering for millimeter wave RF communication systems, aspects of this disclosure relate to systems and methods for precisely controlling the gain magnitude and phase across multiple Tx and Rx chains. For example, these magnitude and trimming circuits can be used to compensate for the systemic and random offsets described above. The magnitude and phase trimming circuits enable relatively small, precise digitally-controlled adjustments while consuming minimal power and die area when compared to traditional approaches. For example, traditional phase adjustment techniques are typically narrow-band, bulky and/or both. In many cases, the traditional switched attenuator techniques are bulky and/or provide poor return loss.

In contrast, aspects of this disclosure provide trimming circuits which are more compact that traditional techniques while also enabling phase advance or delay, and attenuation increase or decrease. In certain embodiments, the circuits consume no DC power. In many embodiments, the circuits can be adjusted for nominally perfect impedance match, allowing the circuits to be cascaded. Compared to previous solutions, aspects of this disclosure use less die area and DC power and do not degrade return loss.

Figure 5:
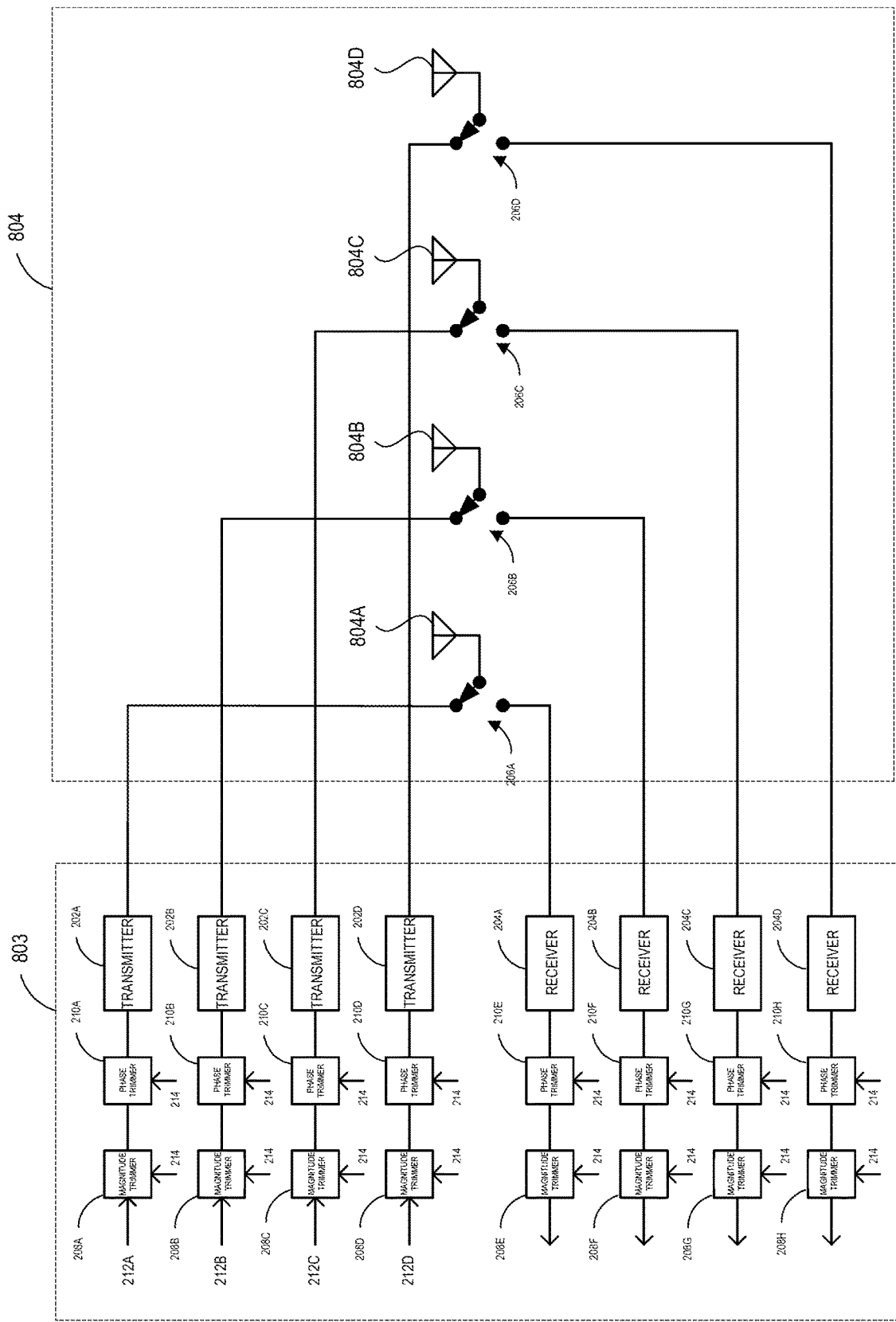
FIG. 5 is a schematic diagram of an embodiment of a portion of a front end system and a plurality of antennas in accordance with aspects of this disclosure.

FIG. 5 is a schematic diagram of an embodiment of a portion of a front end system 803 and a plurality of antennas 804 in accordance with aspects of this disclosure. In particular, the front end system 803 includes a plurality of transmitters 202A-202D and receivers 204A-204D which are configured to be connect alternately to antennae 804A-804D via switches 206A-206D. The front end system 803 further includes a plurality of magnitude trimmers 208A-208H and phase trimmers 210A-210H, which are respectively connected to the transmitters 202A-202D and receivers 204A-204D. Each of the magnitude trimmers 208A-208H and the phase trimmers 210A-210H is further configured to receive a control signal 214 used to set the amount of magnitude or phase trim individually applied by each of the trimmers 208A-208H and 210A-210H. In some embodiments, the control signal 214 may be a digital signal, however, aspects of this disclosure are not limited thereto and the control signal 214 may be an analog signal in certain implementations.

As shown in FIG. 5 the transmitters 202A-202D are connected to the antennae 804A-804D and are further configured to receive input signals 212A-212D to be provided to the antennae 804A-804D. In the simple case where the input signals 212A-212D are replicas of the same signal with RF phase offsets between them, the magnitude trimmers 208A-208D and phase trimmers 201A-210D can be configured to tune out any path-to-path or part-to-part variation so that the overall combined antenna beam is aimed precisely.

A theoretically ideal magnitude or phase trimmer would provide small, precise, digitally-controlled adjustments of the desired parameter (e.g., magnitude or phase) with no or a minimal effect on the other parameter (e.g., phase or magnitude). Such a theoretically ideal trimmer would also be symmetrical and present a good match to the nominal system impedance. The theoretically ideal trimmer would further consume no DC power and occupy minimal chip area and would be insensitive to supply voltage and temperature.

Figure 6:
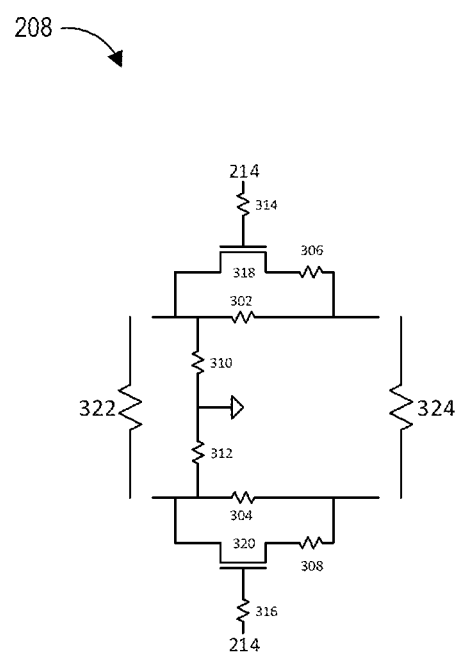
FIG. 6 is a schematic diagram of an embodiment of a magnitude trimmer in accordance with aspects of this disclosure.

FIG. 6 is a schematic diagram of an embodiment of a magnitude trimmer 208 in accordance with aspects of this disclosure. As shown in FIG. 6, the magnitude trimmer 208 includes a plurality of resistors 302-316, a plurality of transistors 318 and 320 and is connected between RF termination impedances 322 and 324, which do not form a part of the magnitude trimmer 208 itself. FIG. 6 relates to an embodiment of the magnitude trimmer 208 implemented with series elements (e.g., resistors 306 and 308).

The resistors 302 and 304 are series resistors, each having a relatively small value (e.g., the resistances of resistors 302 and 304 are much less than the RF termination impedances 322 and 324). In some implementations, the resistances of resistors 302 and 304 may be less than about 5% of the RF termination impedances 322 and 324. The transistor 318 and resistor 306 are connected across series resistor 302, while the transistor 320 and resistor 308 are connected across series resistor 304, which results in a reduction of the overall series resistance, and therefore, the loss introduced by the magnitude trimmer 208. Each of the resistors 310 and 312 has a relatively large value (e.g., the resistances of resistors 310 and 312 are much greater than the RF termination impedances 322 and 324). The resistors 314 and 316 are gate isolation resistors which prevent or reduce RF leakage through the transistor 318 and 320 gates. The resistors 314 and 316 may also each have a relatively large value, similar to the resistors 310 and 312. The transistors 318 and 320 are configured to receive the digital control signal 214. When the control signal 214 has a positive value (+V) to turn on the transistors 318 and 320, the magnitude trimmer 208 will have a reduced loss, thereby reducing the amount of magnitude trim provided by the magnitude trimmer 208. Alternatively, when the control signal has a negative value (−V) to turn off the transistors 318 and 320, the magnitude trimmer 208 will have an increased loss, thereby increasing the amount of magnitude trim provided by the magnitude trimmer 208.

Figure 7:
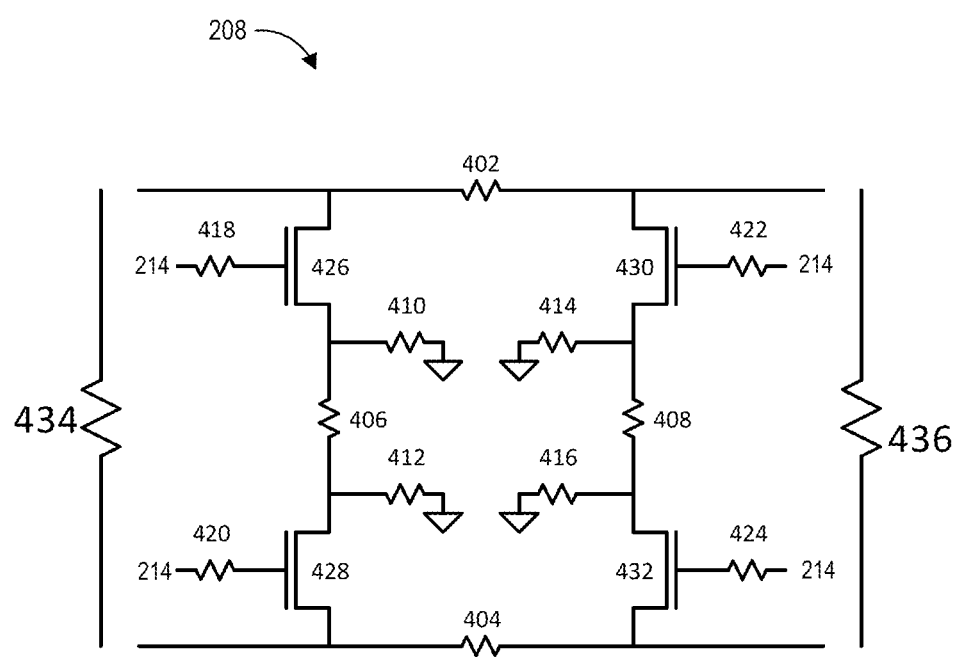
FIG. 7 is a schematic diagram of another embodiment of a magnitude trimmer in accordance with aspects of this disclosure.

FIG. 7 is a schematic diagram of another embodiment of a magnitude trimmer 208 in accordance with aspects of this disclosure. As shown in FIG. 7, the magnitude trimmer 208 includes a plurality of resistors 402-424, a plurality of transistors 426-432 and is connected between RF termination impedances 434 and 436, which do not form a part of the magnitude trimmer 208 itself. FIG. 7 relates to an embodiment of the magnitude trimmer 208 implemented with shunt elements (e.g., resistors 410-416).

Similar to the embodiment of FIG. 6, the magnitude trimmer 208 of FIG. 7 includes a pair of series resistors 402 and 404, each having a relatively small value (e.g., the resistances of resistors 302 and 304 are much less than the RF termination impedances 434 and 436). In this embodiment, the magnitude trimmer 208 is configured to adjust attenuation by switching in shunt resistors 406 and 408 by means of the transistors 426-432. The resistors 410-416 are channel bias resistors and each has a relatively large value (e.g., the resistances of resistors 410-416 are much greater than the RF termination impedances 434 and 436). Similarly, the resistors 418-424 are gate isolation resistors which prevent or reduce RF leakage through the transistor 426-432 gates and each of the resistors 418-424 has a relatively large value, similar to the resistors 410-416.

In the embodiment of the magnitude trimmer 208 of FIG. 7, the digital control signal 214 having a positive value (+V) will increase loss of the magnitude trimmer 208, while a negative value (−V) for the digital control signal 214 will decrease loss of the magnitude trimmer 208.

Figure 8:
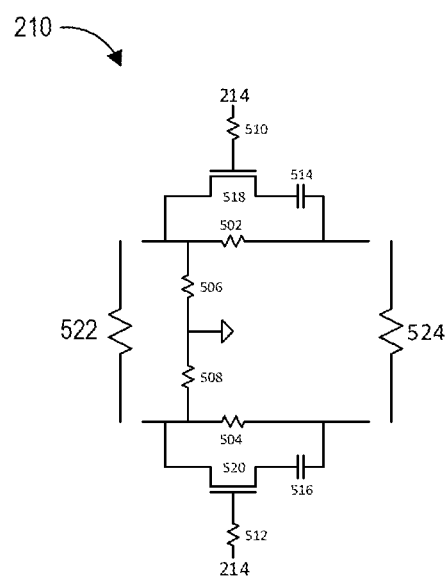
FIG. 8 is a schematic diagram of an embodiment of a phase trimmer in accordance with aspects of this disclosure.
Figure 9:
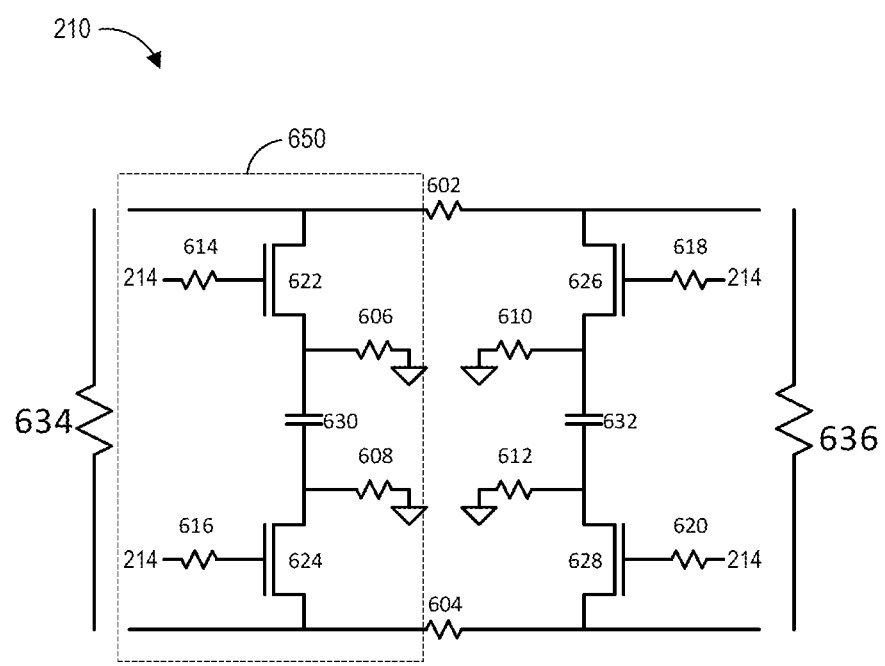
FIG. 9 is a schematic diagram of another embodiment of a phase trimmer in accordance with aspects of this disclosure.

The implementations of FIGS. 6 and 7 can also be modified to implement a phase trimmer 210 by replacing some of the resistors with capacitors as shown in the embodiments of FIGS. 8 and 9.

FIG. 8 is a schematic diagram of an embodiment of a phase trimmer 210 in accordance with aspects of this disclosure. As shown in FIG. 8, the phase trimmer 210 includes a plurality of resistors 502-512, a plurality of capacitors 514 and 516, a plurality of transistors 518 and 520 and is connected between RF termination impedances 522 and 524, which do not form a part of the magnitude trimmer 208 itself. FIG. 8 relates to an embodiment of the phase trimmer 210 implemented with series elements (e.g., capacitors 514 and 516).

In the phase trimmer 210 illustrated in FIG. 8, the transistors 518 and 520 are configured to switch in the capacitors 514 and 516 to provide a phase advance. When the digital control signal 214 has a positive value (+V) the phase trimmer 210 increases the phase advance, while when the digital control signal has a negative value (−V) the phase trimmer 210 decreases phase advance. The amount of phase shift provided by the phase trimmer 210 can be determined by the reactance of the capacitors 514 and 516 relative to the resistors 502 and 504 as well as the RF termination impedances 522 and 524. The capacitance introduced by the capacitors 514 and 516 may be lower than a predetermined value (e.g., much less than a reactance of the RF termination impedances 522 and 524) in order to reduce the amount of insertion loss introduced by the phase trimmer 210. In some implementations, the predetermined value may depend on the RF frequency and the resistance value of the resistors 502 and 504, for example, the capacitance introduced by the capacitors 514 and 516 may be lower than 1/(40*pi*f*Rs), where f is the RF frequency and Rs is the resistance value of the resistors 502 and 504.

In another embodiment, the capacitors 514 and 516 shown in FIG. 8 can be replaced with inductors (not illustrated) to provide a phase delay instead of a phase advance. In this embodiment, when the digital control signal 214 has a positive value (+V) the phase trimmer 210 increases the phase delay, while when the digital control signal has a negative value (−V) the phase trimmer 210 decreases phase delay. The amount of phase shift provided by the phase trimmer 210 can be determined by the reactance of the inductors relative to the resistors 502 and 504 as well as the RF termination impedances 522 and 524. The inductance introduced by the inductors may be lower than a predetermined value (e.g., much less than a reactance of the RF termination impedances 522 and 524) in order to reduce the amount of insertion loss introduced by the phase trimmer 210. In some implementations, the predetermined value may depend on the RF frequency and the resistance value of the resistors 502 and 504, for example, the inductance introduced by the inductors may be lower than 10*Rs/(pi*f), where f is the RF frequency and Rs is the resistance value of the resistors 502 and 504.

FIG. 9 is a schematic diagram of another embodiment of a phase trimmer 210 in accordance with aspects of this disclosure. As shown in FIG. 9, the phase trimmer 210 includes a plurality of resistors 602-620, a plurality of transistors 622-628, a plurality of capacitors 630 and 632, and is connected between RF termination impedances 634 and 636, which do not form a part of the phase trimmer 210 itself. FIG. 9 relates to an embodiment of the phase trimmer 210 implemented with shunt elements (e.g., resistors 606-612).

In the phase trimmer 210 illustrated in FIG. 9, the transistors 622-628 are configured to switch in the capacitors 630 and 632 as well as the shunt resistors 606-612 to provide a phase delay. When the digital control signal 214 has a positive value (+V) the phase trimmer 210 increases the phase delay, while when the digital control signal has a negative value (−V) the phase trimmer 210 decreases phase delay. The amount of phase shift provided by the phase trimmer 210 can be determined by the reactance of the capacitors 630 and 632 relative to the resistors 602 and 604 as well as the RF termination impedances 634 and 636. The capacitance introduced by the capacitors 630 and 632 may be lower than a predetermined value (e.g., much less than a reactance of the RF termination impedances 634 and 636) in order to reduce the amount of insertion loss introduced by the phase trimmer 210. In some implementations, the capacitance introduced by the capacitors 630 and 632 may be lower than 1/(40*pi*f*Rs), where f is the RF frequency and Rs is the resistance value of the resistors 602 and 604.

Figure 10:
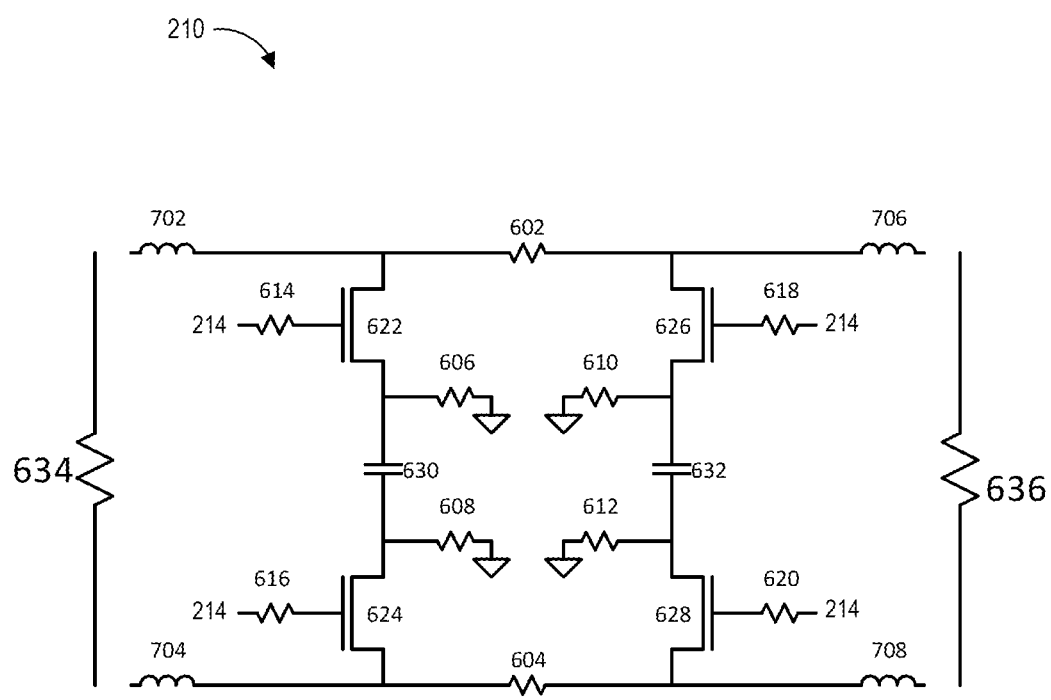
FIG. 10 illustrates a modified version of the phase trimmer of FIG. 9 with the inclusion of series inductors.

In each of the embodiments illustrated in FIGS. 6-9, small series inductors (e.g., see series inductors 702-708 in FIG. 10) may be introduced in the RF input and/or output lines to improve return loss of the magnitude and phase trimmer 208 and 210 circuits. For example, FIG. 10 illustrates a modified version of the phase trimmer 210 of FIG. 9 with the inclusion of series inductors 702-708.

By properly selecting the combination of series and shunt trim elements and a corresponding value of these series inductances can allow the return loss of each trim section to be almost perfect (e.g., less than a predetermined amount), which allows multiple sections of the magnitude and phase trimmers 208 and 210 to be cascaded without incurring mismatch loss or unwanted gain slope. In some implementations, the return loss may satisfy: Rs=sqrt(L/C).

Figures 11A, 11B:
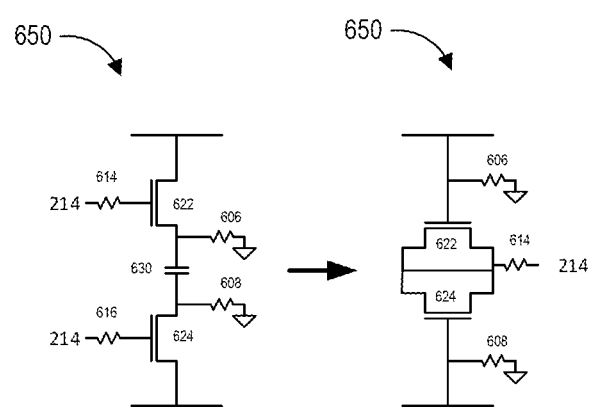
FIGS. 11A and 11B illustrate another modified version of the phase trimmer of FIG. 9 in which a shunt capacitance is added as gate-channel capacitance.

FIGS. 11A and 11B illustrate another modified version of the phase trimmer 210 of FIG. 9 in which a shunt capacitance is added as gate-channel capacitance. In particular, FIG. 11A is a copy of a portion 650 of the phase trimmer 210 of FIG. 9, while FIG. 11B illustrates the modified version of this portion 650 of the phase trimmer 210. In the modified portion 650 illustrated in FIG. 11B, when the digital control signal 214 has a positive value (+V) the capacitance of provided by the transistors 622 and 624 decreases through channel accumulation and when the digital control signal has a negative value (−V) the capacitance of provided by the transistors 622 and 624 increases through channel inversion. By decreasing the capacitance, the portion 650 of the phase trimmer 210 can decrease phase delay, while by increase the capacitance, the portion 650 of the phase trimmer 210 can increase phase delay.

Figure 12A:
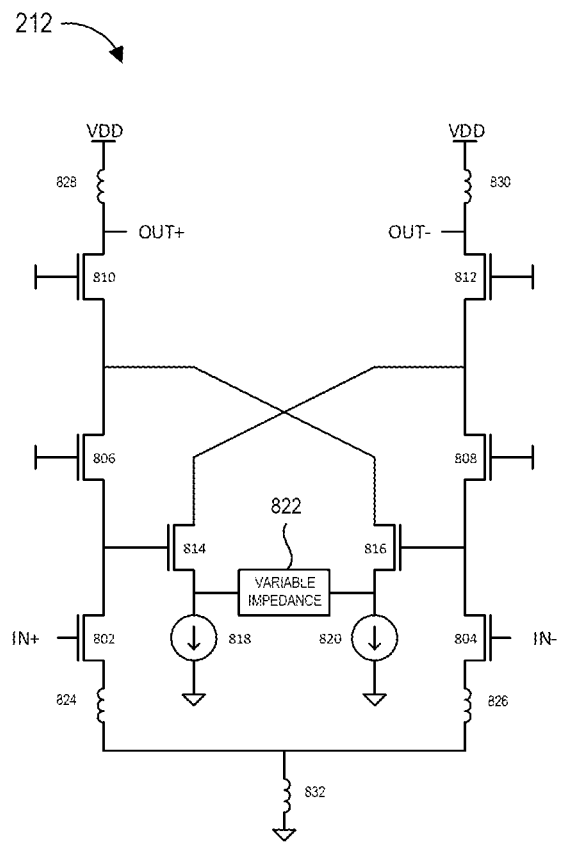
FIG. 12A is a schematic diagram of another embodiment of a trimmer in accordance with aspects of this disclosure.

FIG. 12A is a schematic diagram of another embodiment of a trimmer 212 in accordance with aspects of this disclosure. As shown in FIG. 12A, the trimmer 212 includes a plurality of transistors 802-816, a plurality of current sources 818 and 820, a variable impedance 822, and a plurality of inductors 824-832. The trimmer 212 is connected between two reference voltages VDD and ground. The trimmer 212 also includes two input terminals IN+ and IN− and two output terminals OUT+ and OUT−.

The trimmer 212 of FIG. 12A includes a three-stack power amplifier formed of the transistors 802-812. The transistors 814 and 816, when biased by the current sources 818 and 820, form a differential transconductor having an input voltage that is the same as the differential common-gate pair of transistors 806 and 808. The output current of the differential transconductor adds to the output current of the transistors 806 and 808.

Figure 12B:
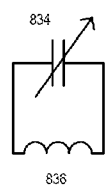
FIG. 12B is a schematic diagram of one implementation of the variable impedance of FIG. 12A.

FIG. 12B is a schematic diagram of one implementation of the variable impedance 822 of FIG. 12A. In the embodiment of FIG. 12B, the impedance 822 is implemented as a parallel LC tank (e.g., including an adjustable capacitor 834 and an inductor 836) near resonance. The relatively small transconductor output current adds in positive, zero or negative quadrature with respect to the main output current from the transistors 806 and 808. By adding current in this way, the trimmer 212 can provide phase trimming by adjusting the phase in both the positive and negative directions through zero, using either digital or analog means to adjust the variable impedance 822.

In another implementation, the variable impedance 822 can be implemented as a variable resistor (not illustrated). When the variable impedance 822 is implemented as a variable resistor, the trimmer 212 can provide magnitude trimming by adjusting the variable resistor. Thus, the trimmer 212 can be implemented as either a phase trimmer 210 or a magnitude trimmer 208 depending on the implementation of the variable impedance 822.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front end system, comprising:
    a plurality of transmitters each configured to provide a corresponding transmit signal to a corresponding antenna of a plurality of antennae;
    a plurality of receivers configured to receive a corresponding receive signal from a corresponding antenna of the plurality of antennae; and
    at least one trimmer connected to at least one of the transmitters or at least one of the receivers and configured to trim the corresponding transmit signal or the corresponding receive signal for beam forming, the at least one trimmer including an input, an output, and at least one transistor configured to control at least one of a magnitude trim and a phase trim of the corresponding transmit signal or the corresponding receive signal via a selectively adjusted impedance coupled with a path between the input and the output, the at least one transistor including a first transistor and a second transistor coupled together and forming a gate-channel capacitance, and the selectively adjusted impedance including an adjusted capacitance of the gate-channel capacitance.

2. The front end system of claim 1 wherein the first transistor and the second transistor are configured to receive a digital control signal, and the gate-channel capacitance increases in response to the digital control signal having a positive value.

3. The front end system of claim 1 wherein the first transistor and the second transistor are configured to receive a digital control signal, and the gate-channel capacitance decreases in response to the digital control signal having a negative value.

4. A front end system, comprising:
    a plurality of transmitters each configured to provide a corresponding transmit signal to a corresponding antenna of a plurality of antennae;
    a plurality of receivers configured to receive a corresponding receive signal from a corresponding antenna of the plurality of antennae; and
    at least one trimmer connected to at least one of the transmitters or at least one of the receivers and configured to trim the corresponding transmit signal or the corresponding receive signal for beam forming, the at least one trimmer including an input, an output, and at least one transistor configured to control at least one of a magnitude trim and a phase trim of the corresponding transmit signal or the corresponding receive signal via a selectively adjusted impedance coupled with a path between the input and the output, the at least one trimmer further including a variable impedance, the at least one transistor including a first transistor and a second transistor, the variable impedance coupled between the first transistor and the second transistor.

5. The front end system of claim 4 wherein the at least one trimmer further includes: a first current source coupled between a first terminal of the variable impedance and a ground terminal, and a second current source coupled between a second terminal of the variable impedance and ground.

6. The front end system of claim 4 wherein the first transistor and the second transistor form a differential transconductor.

7. The front end system of claim 4 wherein the variable impedance includes an adjustable capacitor in parallel with an inductor, and the at least one transistor is further configured to control the phase trim in both positive and negative directions.

8. The front end system of claim 4 wherein the variable impedance includes a variable resistor, and the at least one transistor is further configured to control the magnitude trim in both positive and negative directions.

9. A mobile device, comprising:
a plurality of antennae; and
a front end system including a plurality of transmitters each configured to provide a corresponding transmit signal to a corresponding antenna of the plurality of antennae, a plurality of receivers configured to receive a corresponding receive signal from the plurality of antennae, and at least one trimmer connected to at least one of the transmitters or at least one of the receivers and configured to trim the corresponding transmit signal or the corresponding receive signal for beam forming, the at least one trimmer including an input, an output, and at least one transistor configured to control at least one of a magnitude trim and a phase trim of the corresponding transmit signal or the corresponding receive signal via a selectively adjusted impedance coupled with a path between the input and the output, the at least one transistor including a first transistor and a second transistor coupled together and forming a gate-channel capacitance, and the selectively adjusted impedance including an adjusted capacitance of the gate-channel capacitance.

10. The mobile device of claim 9 wherein the first transistor and the second transistor are configured to receive a digital control signal, and the gate-channel capacitance increases in response to the digital control signal having a positive value.

11. The mobile device of claim 9 wherein the first transistor and the second transistor are configured to receive a digital control signal, and the gate-channel capacitance decreases in response to the digital control signal having a negative value.

12. A mobile device comprising:
a plurality of antennae; and
a front end system including a plurality of transmitters each configured to provide a corresponding transmit signal to a corresponding antenna of the plurality of antennae, a plurality of receivers configured to receive a corresponding receive signal from the plurality of antennae, and at least one trimmer connected to at least one of the transmitters or at least one of the receivers and configured to trim the corresponding transmit signal or the corresponding receive signal for beam forming, the at least one trimmer including an input, an output, and at least one transistor configured to control at least one of a magnitude trim and a phase trim of the corresponding transmit signal or the corresponding receive signal via a selectively adjusted impedance coupled with a path between the input and the output, the at least one trimmer further including a variable impedance, the at least one transistor including a first transistor and a second transistor, the variable impedance coupled between the first transistor and the second transistor.

13. The mobile device of claim 12 wherein the at least one trimmer further includes: a first current source coupled between a first terminal of the variable impedance and a ground terminal, and a second current source coupled between a second terminal of the variable impedance and ground.

14. The mobile device of claim 12 wherein the first transistor and the second transistor form a differential transconductor.

15. The mobile device of claim 12 wherein the variable impedance includes an adjustable capacitor in parallel with an inductor, and the at least one transistor is further configured to control the phase trim in both positive and negative directions.

16. The mobile device of claim 12 wherein the variable impedance includes a variable resistor, and the at least one transistor is further configured to control the magnitude trim in both positive and negative directions.

17. A radio frequency trimmer circuit, comprising:
an input configured to receive a radio frequency signal;
an output configured to output the radio frequency signal; and
at least one transistor configured to control at least one of a magnitude trim and a phase trim of the radio frequency signal via a selectively adjusted impedance coupled with a path between the input and the output, the at least one transistor including a first transistor and a second transistor coupled together, the first and second transistors forming a gate-channel capacitance, and the selectively adjusted impedance achieved by adjusting a capacitance of the gate-channel capacitance.

* * * * *